US009625256B1

(12) United States Patent
Muthur Srinath et al.

(10) Patent No.: US 9,625,256 B1
(45) Date of Patent: Apr. 18, 2017

(54) DEVICE, SYSTEM AND METHOD FOR ALIGNMENT OF AN INTEGRATED CIRCUIT ASSEMBLY

(71) Applicant: Intel Corporation, Santa Clara, CA (US)

(72) Inventors: Purushotham Kaushik Muthur Srinath, Chandler, AZ (US); Mario Pacheco, Tempe, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,973

(22) Filed: Dec. 23, 2015

(51) Int. Cl.
*G01B 11/27* (2006.01)

(52) U.S. Cl.
CPC .................................. *G01B 11/272* (2013.01)

(58) Field of Classification Search
CPC .................................................... G01B 11/272
See application file for complete search history.

(56) References Cited

U.S. PATENT DOCUMENTS

| 5,559,598 | A | * | 9/1996 | Matsumoto | G03F 9/70 356/490 |
| 6,236,222 | B1 | * | 5/2001 | Sur, Jr. | G01R 31/307 324/754.22 |
| 6,480,285 | B1 | * | 11/2002 | Hill | G01B 9/04 356/492 |
| 7,446,873 | B2 | | 11/2008 | Chandhok | |
| 8,004,678 | B2 | | 8/2011 | Weiss et al. | |
| 2002/0048019 | A1 | * | 4/2002 | Sui | G01N 21/21 356/369 |
| 2010/0321705 | A1 | * | 12/2010 | Miyasaka | G03F 9/7076 356/620 |
| 2013/0107259 | A1 | * | 5/2013 | Choi | G03F 7/70683 356/401 |
| 2013/0245978 | A1 | * | 9/2013 | Chen | H01L 21/67259 702/82 |
| 2016/0356970 | A1 | * | 12/2016 | de Jong | G02B 6/4214 |
| 2016/0356971 | A1 | * | 12/2016 | de Jong | G02B 6/4214 |

* cited by examiner

*Primary Examiner* — Mark R Gaworecki
(74) *Attorney, Agent, or Firm* — Blakely, Sokoloff, Taylor & Zafman LLP (57) ABSTRACT

Techniques and mechanisms for evaluating misalignment of circuit structures. In an embodiment, infrared (IR) radiation is variously focused on different planes of an assembly including an integrated circuit (IC) chip and a substrate that is to be coupled to, or that is coupled to, the IC chip. The cross-sectional planes include respective structures that variously reflect IR radiation. The reflected IR radiation is measured to create images each representing a corresponding cross-section of the assembly. In another embodiment, respective reference features of the images are identified and evaluated to determine whether a misalignment between the reference features satisfies one or more threshold test conditions.

20 Claims, 7 Drawing Sheets

DEVICE, SYSTEM AND METHOD FOR ALIGNMENT OF AN INTEGRATED CIRCUIT ASSEMBLY

BACKGROUND

1. Technical Field

Embodiments of the invention relate generally to alignment evaluation and more particularly, but not exclusively, to methods for measuring misalignment of circuit assemblies.

2. Background Art

Alignment accuracy is a critical requirement, in integrated circuit (IC) assemblies, for obtaining reliable electrical interconnections between components for good device operation. Misalignment could lead to an assembled semiconductor device becoming non-functional due to an open circuit or a short defect. Connection integrity problems due to misalignment between a device being attached to a substrate can arise during controlled collapse chip connection (C4) reflow, thermocompression bonding (TCB) or other such processing.

Existing technologies for determining misalignment of integrated circuitry use an x-ray-based approach. These technologies variously generate an image by transmitting x-rays through integrated circuitry after the formation of a connection (or "joint") that couples the integrated circuitry to a board or other substrate. Based on the imaging, analysis is performed to try measure the quality of the connection, using metrics such as joint geometry and alignment between a circuit and a structure connected thereto.

One drawback of the current techniques is an inability to distinguish between structures having materials with similar x-ray absorption, resulting in incorrect evaluation of joint geometry. The evaluation of connections based on x-ray imaging is prone, for example, to false positives as well as to false negatives. Also, the evaluation of circuitry connectivity based on x-ray imaging does not scale well with the smaller geometries of next-generation fabrication techniques. As such fabrication technologies continue to decrease the size and pitch of bumps, pads and other structures, the risk of misalignment-induced assembly yield loss is expected to increase. Accordingly, conventional techniques for detecting circuit assembly alignment and connection integrity are expected to be inadequate for the future demands of manufacturers.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for detection of misalignment, for example, during a chip attach process when an integrated circuit (IC) chip is being coupled to a substrate. In an embodiment, an IC chip is tested for misalignment—after coupling of the IC chip, for example—with an organic substrate, a semiconductor (e.g., silicon) substrate or any of various other types of substrates. The IC chip may include processor logic, controller logic, a memory, a system-on-chip (SoC) or any of various other integrated circuitry types. The substrate may be that of an interposer or, for example, that of another IC chip with which a chip stack is to be formed. Corrective action—e.g., including adjustment to assembly processing, modification to device and/or substrate design, or the like—may be taken based on misalignment information determined according to various embodiments.

Some embodiments collect image data corresponding to different respective planes variously extending in an assembly that includes both an IC chip and a substrate that is to be—or has been—coupled to the IC chip. Unless otherwise indicated, such an assembly is referred to herein as a "chip-substrate assembly" (or, for brevity, simply an "assembly"). Imaging may be performed prior to or after the actual connection of the IC chip to the substrate. In one embodiment, first imaging focuses infrared (IR) radiation on a first plane that is in or on the IC chip (e.g., the first plane including a metallization layer in or on a semiconductor substrate of the IC chip), where second imaging focuses IR radiation on another plane that is in or on a metallization layer or other stratum of a substrate (e.g., in or on another IC chip, interposer silicon, bridge silicon, substrate or board). The first imaging and the second imaging may generate different respective image data that is variously based on reflection of focused IR radiation. Evaluation of the image data may determine, for example, a position of one component of the assembly (e.g., the IC chip) relative to another component of the assembly (e.g., the substrate). Such evaluation may include measuring any misalignment (e.g., including measuring a corresponding degree of alignment) between two reference points each on a respective one of the IC chip and the substrate.

Certain embodiments are based on a realization that some IR band radiation (e.g., in a band including near IR wavelengths and/or medium IR wavelengths) can reflect off of structures in a chip-substrate assembly, and that such reflection, in combination with focusing optics, can be exploited to achieve imaging in different cross-sectional planes of such an assembly. As compared to conventional x-ray techniques, the IR radiation allows for improved (e.g., submicron) alignment accuracy that, for example, can accommodate relatively small features of a chip-substrate assembly. In some embodiments, ICs and devices are designed to incorporate reflective structures that are uniquely for the purpose of being imaged—e.g., using IR band radiation.

The technologies described herein may be implemented in one or more electronic devices. Non-limiting examples of electronic devices that may utilize the technologies described herein include any kind of device such as a computer terminal, desktop computer, dedicated test platform, server, combinations thereof, and the like. Such devices may be portable or stationary. More generally, embodiments may be variously employed in any of a variety of electronic devices including hardware firmware and/or executing software to perform imaging and/or alignment analysis operations as described herein.

Figure 1:
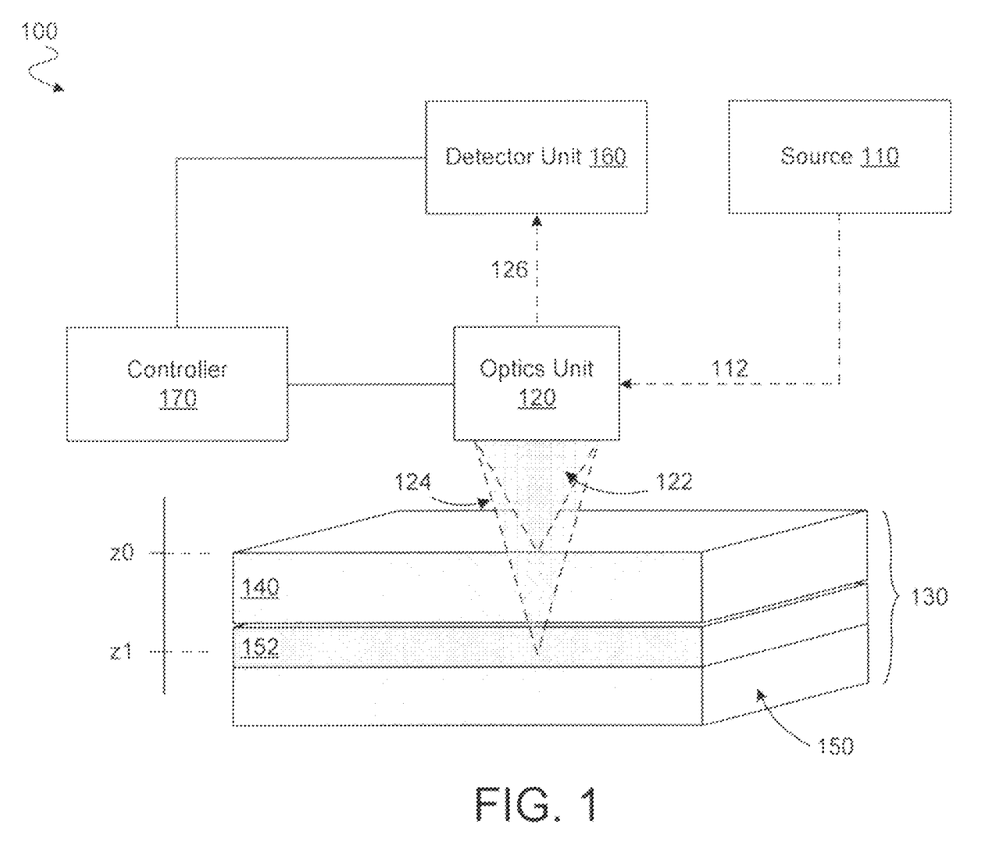
FIG. 1 is a functional block diagram illustrating elements of a system to measure alignment of circuit structures according to an embodiment.

FIG. 1 shows a system 100, according to an embodiment, to measure misalignment of integrated circuitry with respect to other structures. System 100 is one example of an embodiment that performs imaging of a chip-substrate assembly, where the imaging includes detecting reflection of IR light that has been focused, at various times, on various points in different respective cross-sectional planes in or on the chip-substrate assembly. System 100 may evaluate misalignment of between IC chips that are stacked, abutted or otherwise configured relative to one another—e.g., to form a 3D package. Alternatively or in addition, system 100 may evaluate misalignment between an IC chip and the substrate of a flip-chip package, bridge silicon, interposer silicon or the like.

In the illustrative embodiment shown, system 100 includes a source 100 (such as a laser diode) of electromagnetic radiation 112, at least part of which is in an infrared wavelength band (e.g., in a range of 1000 nm to 1500 nm). Electromagnetic radiation 112 may have sufficient power to penetrate some or all structures of a chip-substrate assembly, as represented by the illustrative assembly 130 including an IC chip 140 and a substrate 150. Such structures may include one or more of a semiconductor substrate, thin film metallization, interlayer dielectric materials, a polymer and/or any of various other materials that, for example, are to comprise an IC packaged device. By way of illustration and not limitation, system 100 may perform imaging in aid of evaluating alignment between circuitry, die bump or pad, or a specialized fiducial (not shown) in or on IC chip 140 and bumps, pads, conductive I/O contacts, specialized fiducials and/or other structures in metallization layer 152 of substrate 150.

System 100 may further comprise an optics unit 120 to receive electromagnetic radiation 112 from source 110. Optics unit 120 may include one or more mirrors, lenses and/or other devices to direct at least a portion of electromagnetic radiation 112 toward assembly 130. The directing by optics unit 120 may include focusing first IR radiation 122 at a first point on or within IC chip 140 and, at a different time, focusing second IR radiation 124 at a second point on or within substrate 150. In an embodiment, an offset of one of the points from some reference plane—e.g., in a direction orthogonal to that reference plane—is different than any corresponding offset of the other point from that same reference plane. Such a reference plane may include, or extend in parallel with, a surface of IC chip 140 (or a surface of substrate 150). By way of illustration and not limitation, first IR radiation 122 may be focused on a point of IC chip 140 that is at a level $z0$ along a line of direction extending orthogonally through opposing sides of IC chip 140. In such an embodiment, second IR radiation 124 may be focused on a point of metallization layer 152 that is at a level $z1$ along the same line of direction.

Portions of first IR radiation 122 and second IR radiation 124 may be variously reflected, at different times, by respective structures of assembly 130. A detector unit 160 of system 100 may be optically coupled to variously receive such reflected radiation—e.g., via optics unit 120. For example, detector unit 160 may include one or more photodiodes and/or other photodetectors that are sensitive to light in an IR band. The one or more detectors may sense IR light 126 reflected from assembly 130, where at one time, IR radiation 126 includes a reflected portion of first IR radiation 122 and, at another time, IR radiation 126 includes a reflected portion of second IR radiation 124.

In one embodiment, structures located in different respective layers of assembly 130 may be imaged based on scanning with an IR beam, where the IR beam is variously focused on different respective layers at different times of the scanning. Based on reflection of IR light that is focused at one layer of the assembly, image data may be generated to provide a cross-sectional view of assembly at that layer. Based on the image data, an analysis may automatically or otherwise be performed to detect one or more structures. Such one or more structures may include, for example, a specifically designed reflective fiducial and/or a feature of a functional component in or on an IC die or a substrate assembled with the IC die. An amount and/or direction of any misalignment may be measured based on identification of such structures as references—e.g., based on a comparison of the respective locations of two or more such structures.

For example, controller 170 may include a processor, controller, memory, state machine, firmware, executing software and/or other logic to determine image data based on the sensing of reflected IR radiation 126 by detector unit 160. In some embodiments, controller logic 170 (or other logic included in or coupled to system 100) performs analysis of such image data to determine, for example, whether any misalignment of IC chip 140 relative to substrate 150 is greater than some threshold amount. Such analysis may include accessing some predetermined, a priori reference data describing reference points of assembly 130 and/or describing a maximum acceptable level of at least some type of misalignment between IC chip 140 and substrate 150. In one illustrative embodiment, reference data may identify respective features, in each of two or more cross-sections of an assembly, which are to serve as references for evaluating misalignment. The reference data may further identify, for one or more pairs of such reference features, one or more maximum allowable offsets (e.g., including multiple offsets each in a different respective dimension). The particular reference data used, and the techniques by which such reference data is determined, is not limiting on some embodiments, and may vary significantly according to implementation specific details.

Logic of controller 170 may control optics unit 120 by selectively transitioning optics unit 120 between focusing IR light on different points in or on assembly 130. By way of illustration and not limitation, signaling from controller 170 may cause movement of optics unit 120 relative to assembly 130—e.g., to selectively move optics unit 120 closer to or farther from assembly 130. Alternatively or in addition, signaling from controller 170 may cause a focal distance of optics unit 120 to be selectively lengthened or shortened.

As compared to conventional misalignment detection, which is based on x-ray imaging, IR-based techniques according to various embodiments may be adapted to evaluating an assembly of devices having relatively smaller bump size, pitch, geometry, etc. Additionally or alternatively, such embodiments may be relatively less constrained due to an ability to measure and evaluate misalignment, independent of the joint geometry and/or materials (e.g., metallurgy) used for interconnection, which is not possible using conventional x-ray imaging based techniques. Such IR imaging may allow for relatively fast throughput analysis that can be adapted for misalignment detection that is in-line (or offline)

with device assembly manufacturing. Some embodiments may perform IC misalignment detection at a unit, strip, panel or wafer level—e.g., including processing of a single sample or a plurality of samples by using an automated testing stage and software.

Figure 2:
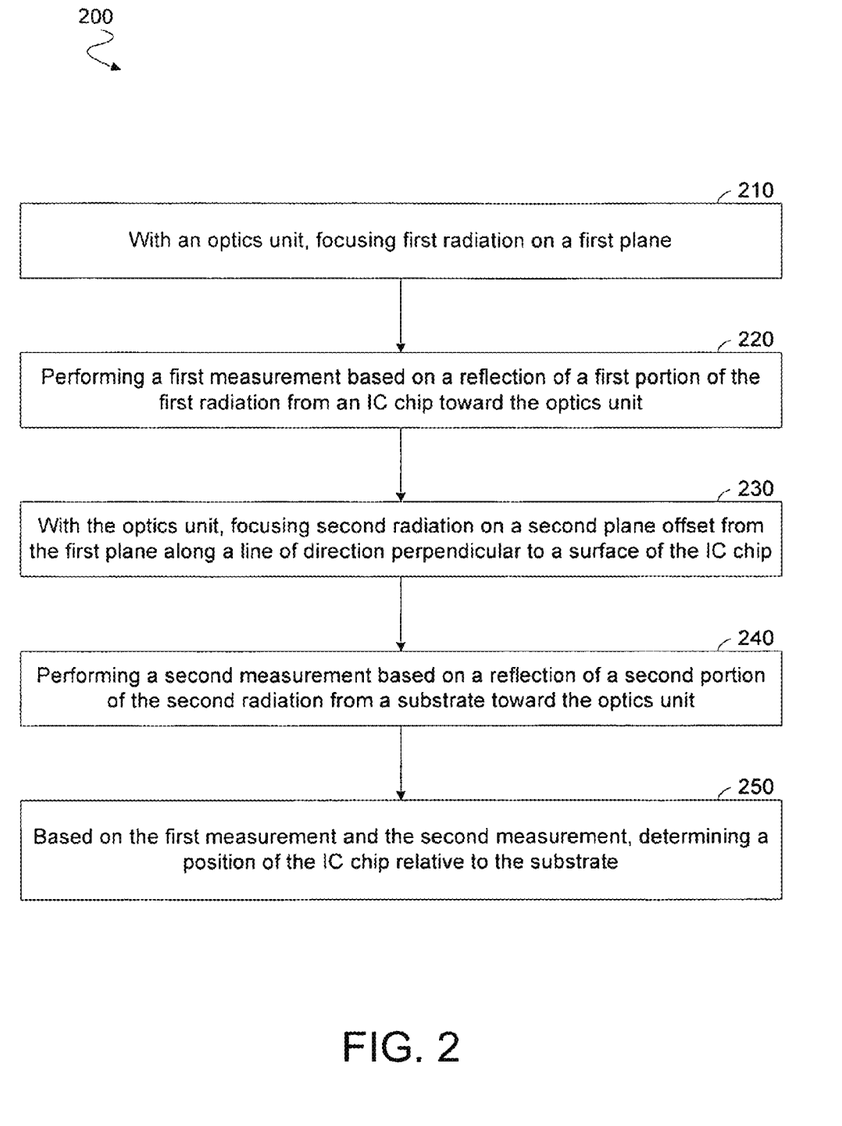
FIG. 2 is a flow diagram illustrating elements of a method for evaluating alignment of circuitry according to an embodiment.

FIG. 2 shows features of a method 200 to evaluate alignment of a chip-substrate assembly according to an embodiment. Method 200 is one example of an embodiment that provides for IR imaging variously focused at different levels of a chip-substrate assembly. Method 200 may be performed with hardware, firmware executing software and/or other mechanisms having features of system 100, for example.

Method 200 may include, at 210, focusing first radiation on a first plane, the focusing with an optical unit such as optics unit 120. The focusing at 210 may include focusing infrared radiation on a first location disposed in or on a chip-substrate assembly. In an embodiment, the first plane includes the surface of the chip-substrate assembly (e.g., a surface of the IC chip). Alternatively, the first plane may be offset from, and extend in parallel to, such a surface—e.g., where the first plane includes an interior cross-section of the IC chip.

The first radiation (and, for example, a subsequent second radiation) may have one or more wavelengths that are in an infrared band within a range from 700 nanometers (nm) to 1000 nm (or 1 millimeter). By way of illustration and not limitation, the focusing at 210 may include variously focusing radiation in an IR band that is in a range from 900 nm to 3000 nm (e.g., in a range from 950 nm to 1800 nm). In some embodiments, the IR band is within a range from 1000 nm to 1250 nm (e.g., within a range from 1100 nm to 1200 nm). However, any of a variety of other types of IR radiation may be used for imaging a chip-substrate assembly, according to different embodiments.

The amount of power needed for IR radiation to penetrate through structures of a chip-substrate assembly may depend, for example, on the thickness of such structures, the amount of any IR-absorbent materials, the doping of materials and/or the like. Although relatively short wavelength IR radiation will tend to result in better imaging resolution, higher power may be needed for such IR radiation to penetrate a chip-substrate assembly. By way of illustration and not limitation, the power of IR radiation may be 5 milliWatts (mW) or more. For example, the power of IR radiation may be 10 mW or more (e.g., 50 mW or more). In some embodiments, the power of IR radiation is in a range of 5 mW to 2 Watts (W). For example, IR radiation may have a power level in a range of 5 mW to 500 mW (e.g., in a range of 10 mW to 20 mW). In another embodiment, IR radiation has a power level in a range of 1 W to 2 W. However, the dimensions, materials, doping and/or other characteristics of a chip-substrate assembly may vary significantly according to implementation specific details. Accordingly, some embodiments vary widely with respect to the power of IR signals needed to perform imaging of different levels in a chip-substrate assembly.

In one embodiment, method 200 includes, at 220, performing a first measurement based on a reflection of a first portion of the first radiation from an integrated circuit chip. The first portion may be reflected from the IC chip along an optical path through the optics unit, for example. The first measurement performed at 220 may be performed with one or more photodiodes, or other such detectors, to detect a strength of reflected IR radiation. Such detection may include operations—e.g., adapted from conventional IR sensing techniques—to generate image data representing structure in the first plane. Prior to the first measurement performed at 220, method 200 may reduce an amplitude of the reflected first portion to protect operation of IR detector mechanisms.

In one embodiment, method 200 includes signaling that a first plurality of measurements are to be taken each while the optics unit focuses IR radiation in the first plane, the first plurality of measurements including the first measurement performed at 220. In such an embodiment, method 200 may further include signaling, during the first plurality of measurements, that the chip-substrate assembly is to move, relative to the optics unit, in a direction parallel to the first plane. Such a first plurality of measurements may represent at least part of a cross-sectional image of the chip-substrate assembly in the first plane.

As shown at 230, method 200 may further comprise, with the optics unit, focusing second radiation in a second plane that is offset from the first plane along a line of direction perpendicular to a surface of the IC chip. The second radiation may include one or more wavelengths in an IR wavelength band and may be focused at 230 in a plane that is offset from, and extends in parallel to, the IC chip surface. For example, the second plane may include a cross-section of a substrate that is stacked with the IC chip. In an embodiment, method 200 further comprises one or more operations (not shown) that transition imaging hardware between respective configurations for the focusing at 210 and the focusing at 230. Such transitioning may include signaling that the optics unit is to move closer to the IC chip or farther from the IC chip. Alternatively or in addition, such transitioning may include signaling that the optics unit is to transition between different ones of a plurality of focal lengths at which the optics unit can focus radiation (e.g., by switching between, or otherwise reconfiguring, various lenses of the optics unit).

Method 200 may further include, at 240, performing a second measurement based on a redirection of a second portion of the second radiation from a substrate toward the optics unit. The second measurement at 240 may include operations, adapted from conventional IR sensing techniques, to generate additional image data representing structure in the second plane. In one embodiment, method 200 includes signaling that a second plurality of measurements are to be taken each while the optics unit focuses IR radiation in the second plane, the second plurality of measurements including the second measurement. In such an embodiment, method 200 may further include signaling, during the second plurality of measurements, that the chip-substrate assembly is to move, relative to the optics unit, in a direction parallel to the second plane. Such a second plurality of measurements may provide at least part of a cross-sectional image of the chip-substrate assembly in the second plane.

At 250, method 200 may further include determining, based on the first measurement and the second measurement, a position of the IC relative to the substrate. For example, the determining at 250 may include generating, based on the first measurement and the second measurement, one or more signals indicating the position of the IC relative to the substrate. Based on the one or more signals and some pre-determined reference information, method 200 may further identify an adjustment to the position of the IC relative to the substrate. The reference information may describe the location, shape, size and/or other characteristics of one or more structures that are to be used as fiducials (e.g., reference points) for evaluating misalignment between the IC chip and the substrate. In an embodiment, identifying a fiducial includes performing image processing to identify a geometric shape in the image, and calculating the location of a corner, edge, centroid or other feature of the geometric shape. Such identifying and calculating may include operations adapted from conventional image recognition techniques, which are not detailed herein to avoid obscuring certain features of some embodiments.

By way of illustration and not limitation, method 200 may variously focus first IR light, over time, on different points in the first plane and perform first imaging (comprising the first measurement at 220) of the first plane based on reflection of the first IR light. Alternatively or in addition, method 200 may variously focus second IR light over time on different points in the second plane and perform second imaging (comprising the second measurement at 240) of the second plane based on reflection of the second IR light. In such an embodiment, method 200 may identify, based on the first imaging, a first location of a first fiducial structure of IC chip. The first fiducial may include, for example, a metallization structure disposed in or on the IC chip. Similarly, method 200 may further identify, based on the second imaging, a second location of a second fiducial structure of the substrate that is stacked with the IC chip. The second fiducial may include, for example, an I/O contact (e.g. a pad, bump or the like) or other metallization structure disposed in or on the substrate.

In such an embodiment, method 200 may further include determining an offset (e.g., a one-dimensional offset or a two-dimensional offset) between the first location of the first fiducial and the second location of the second fiducial. Determining the offset may include determining one or more offset values each in a respective dimension of a coordinate system (e.g., the coordinate system including two dimensions). In an embodiment, determining the offset includes determining an offset length and an offset direction. Based on the offset, method 200 may determine whether to adjust a position of the substrate relative to the IC chip (and/or a position of the IC chip relative to the substrate). Determining whether to adjust that position may include comparing the offset to reference information representing at threshold maximum level of acceptable misalignment.

Figure 3:
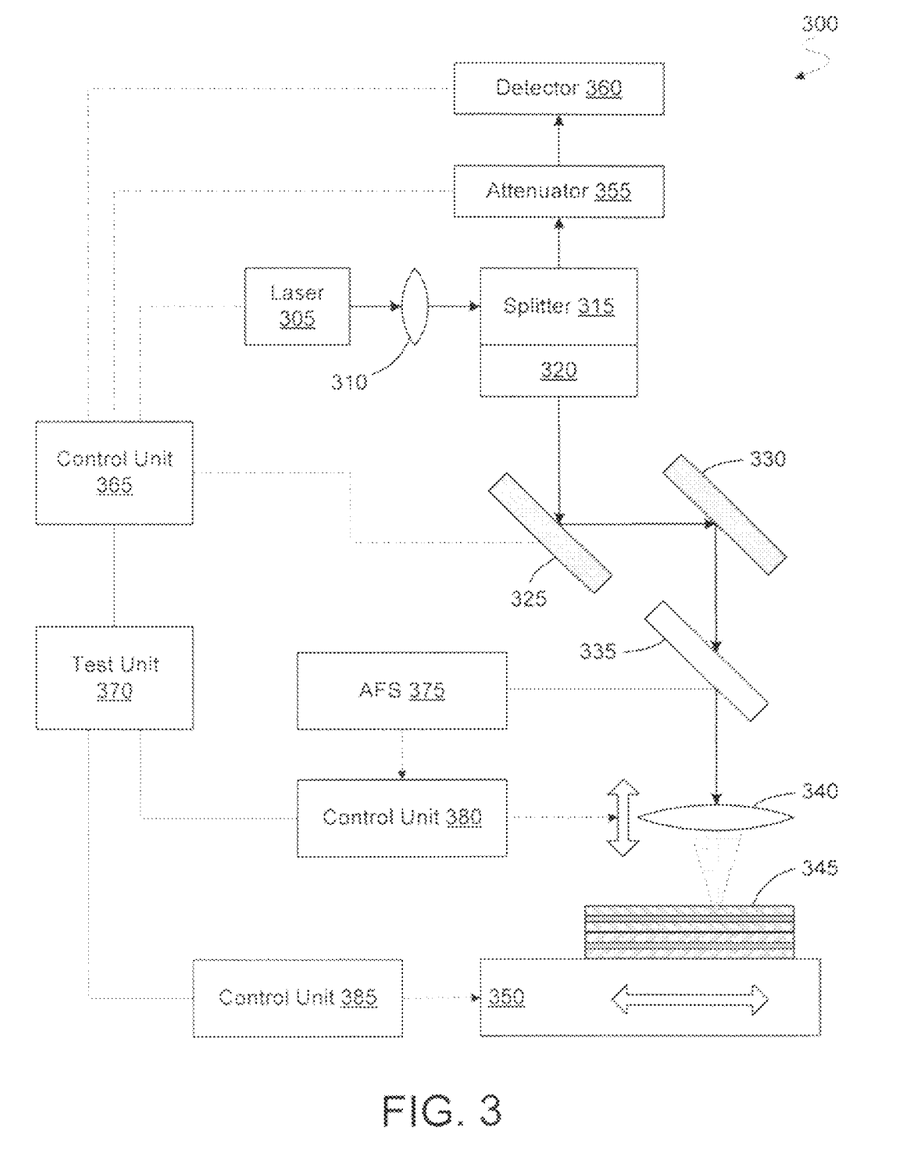
FIG. 3 is a functional block diagram illustrating elements of a system to evaluate circuit alignment according to an embodiment.

FIG. 3 shows a system 300 to evaluate misalignment of an IC-substrate assembly according to an embodiment. System 300 is merely one example of an embodiment that selectively focuses IR radiation on points at different respective depths, as measured relative to some reference point or plane, to variously image an assembly including an integrated circuit chip and a substrate that is coupled to (or is to be coupled to) the IC chip. System 300 may include features of system 100 and/or may perform one or more operations of method 200, for example.

In the illustrative embodiment of system 300, a linearly polarized laser diode 305 emits IR radiation that passes through one or more optical lenses—e.g., including the illustrative lens 310—to produce a collimated beam. A beam splitter 315 of system 300 may receive the collimated beam, where polarized radiation is then passed from splitter 315 through a quarter wavelength plate 320. In one embodiment, beam splitter 315 includes a polarizing beam splitter, for example. Additionally or alternatively, laser 305 may include a linearly polarized laser. The radiation output from quarter wavelength plate 320 may include a circular or elliptical polarized IR beam.

System 300 may include one or more galvanometric mechanisms to variously redirect IR radiation and sense IR radiation intensity (e.g., based on current generated by IR radiation). Such galvanometer mechanisms may be used as a basis for feedback to determine whether IR radiation intensity is to change, whether reflected IR signals are within an acceptable range, how imaging is to proceed, etc. By way of illustration and not limitation, the collimated and polarized IR light output from quarter wavelength plate 320 may be reflected from a mirrored surface of a galvanometer 325 toward the mirrored surface of another galvanometer 330. After reflection from galvanometer 330, the IR beam may pass through a spectral mirror 335 that, for example, reflects visible spectrum (e.g., <600 nm) light but allows transmission of substantially all radiation in an IR wavelength band.

IR radiation passed by spectral mirror 335 may be selectively focused—e.g. using the illustrative objective lens 340—at a plane in or on a chip-substrate assembly 345 that is to be imaged. The IR beam may be at least partially reflected by structure of chip-substrate assembly 345, where a portion of the IR beam is sent along an optical path to a photodetector 360 of system 300. In one embodiment, the optical path includes objective lens 340, spectral mirror 335, galvanometers 325, 330, quarter wavelength plate 320, splitter 315 and an attenuator 355. In passing through quarter wavelength plate 320 twice, the reflected IR radiation will be shifted ninety degrees (90°), thus allowing it to pass through splitter 315 toward attenuator 355 (e.g., rather than back to lens 310). Attenuator 355 may reduce an amplitude of the reflected IR radiation to mitigate damage to the detector 360 (e.g., including one or more photodiodes).

In an embodiment, control logic of system 300—e.g., comprising hardware, firmware and/or executing software—coordinates the directing, focusing, and detection of IR radiation to image multiple cross-sectional planes of chip-substrate assembly 345 (or other such assembly to be evaluated with system 300). One example of such control logic is represented as including the illustrative control units 365, 380, 385 and test unit 370. Such control logic may include one or more of state machine, application specific integrated circuit (ASIC), controller, processor, software and/or the like. The control logic may further include or couple to the illustrative autofocus sensor (AFS) 375, in some embodiments. However, any of a variety of additional or alternative arrangements of control logic may be provided for operation of system 300, according to different embodiments. For example, although shown as being distinct from each other, some or all of the functionality of control units 365, 380, 385 and test unit 370 may be variously implemented in one or more units that are fewer in number, greater in number and/or otherwise differently configured, according to different embodiments.

In the illustrative embodiment shown, AFS 375 may keep an IR beam spot focused on a plane that is to be imaged by operating a linear positioner to automatically adjust a height (along a z-axis in an x, y, z coordinate system) of the objective lens 340 relative to a surface of chip-substrate assembly 345. The AFS 375 and linear positioner may be connected to a control unit 380 that interfaces with test unit 370. Under the control of control unit 365, galvanometer 325 may be moved to produce oscillations in one (x-axis) direction while galvanometer 330 is controlled to move the x-domain scans in an orthogonal (y-axis) direction, thus providing a two dimensional X-Y domain and range of scanning motion with the IR beam. Control unit 365 may further control the variable attenuator 355 and/or laser 305—e.g., to properly adjust the power of the IR beam that is received by the photodetector 360 without saturating it.

During processing, chip-substrate assembly 345 may be located on an adjustable mount 350 which is connected to control unit 385. In turn, control unit 385 may interface with test unit 370 to properly position a location that is to be imaged, in or on the chip-substrate assembly 345, within a focus point of the IR beam. In an embodiment, AFS 375 may be programmed to sequentially focus the IR beam in two or more planes that are to be imaged.

The control unit 365 may synchronize an output of the photodetector 360 with the oscillation of galvanometers 325, 330, and interface with test unit 370 to render an X-Y plot of locations where the IR beam is reflected inside the chip-substrate assembly 345. Respective structures of the IC chip and the substrate (e.g., another IC chip) may variously reflect IR radiation for imaging of the structures the respective locations of such structures may be determined and compared to one another—e.g., by processing logic of control unit 365 and/or test unit 370—to quantify any die-to-substrate misalignment.

Figure 4:
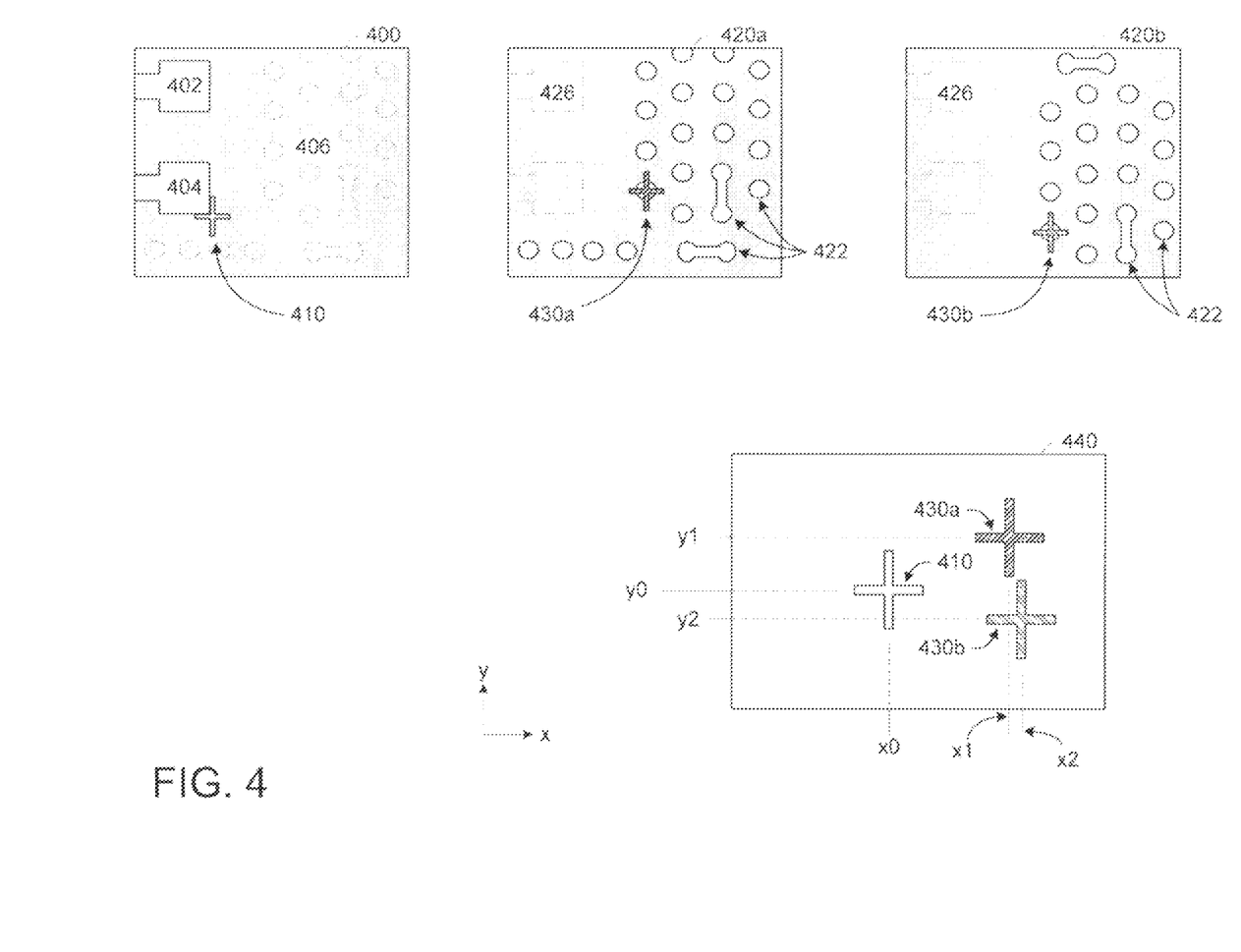
FIG. 4 illustrates features of images that are analyzed to measure alignment of circuit structures according to an embodiment.

FIG. 4 shows an example of image data generated with variously focused IR radiation according to an embodiment. The image data represented in FIG. 4 may be generated with one of systems 100, 300, for example. In one embodiment, such image data is generated according to method 200. FIG. 4 represents in white some illustrative structures that strongly reflect IR radiation, where other areas are shown in grey. Depending on wavelength and/or power, IR radiation may variously propagate through one or more of a base silicon substrate material and/or one or more interlayers of dielectric material (such as one including silicon oxide or silicon nitride). Additionally or alternatively, IR radiation may propagate through any of a variety of polymers (e.g., including polyamide), passivation materials, solder masks, Ajinomoto build-up films and/or other relatively more IR-transparent materials.

The illustrative image 400 shows a first cross-section in a first plane of a chip-substrate assembly. The first cross-section may extend, for example, through an IC chip having formed therein or thereon metallization including contact pads 402, 404. In image 400, dashed lines in an area 406 illustrate structures that are not in first plane of the first cross-section, but which are offset orthogonally from area 406 of the first plane. To aid in evaluating misalignment of circuit structures, some embodiments variously access reference information describing a location of one or more reference points. For example, a reference marker 410 may be superimposed on image 400 based on processing that identifies a feature (in this example, a corner of contact pad 404) that is to be used as a reference point.

Image 420a shows a second cross-sectional image in a second plane of the chip-substrate assembly. The second cross-section may extend, for example, through a substrate (e.g., of an interposer or another IC chip) that is stacked with the IC chip represented in image 400. In the illustrative image 420a, the substrate has formed therein or thereon various metallization structures 422 that, for example, are offset orthogonally from area 406 of the first plane. Dashed lines in an area 426 of image 420a illustrate where contact pads 402, 404 are offset orthogonally from the second plane. Based on image analysis according to one embodiment, a reference marker 430a may be superimposed on image 420a to identify a feature that is to be used as another reference point for evaluating misalignment. In the example embodiment, reference marker 430a marks the centroid of a via structure's cross-sectional profile.

Image 420b shows a different cross-sectional image that, like image 420a, is also in the second plane of the chip-substrate assembly. Images 420a, 420b correspond to different respective positions of the same substrate, relative to the IC chip shown in image 400. For example, image 420b has a superimposed marker 430b that corresponds to a different location of the same centroid feature that is marked in image 420a by marker 410a. Analysis of images 400, 420a, 420b according to one embodiment may include identifying, in an x-y plane, the location (x0, y0) of the marker 410, the location (x1, y1) of the marker 430a and the location (x2, y2) of the marker 430b.

As represented by the superimposed image 440, the respective positions of markers 430a, 430b may be variously evaluated—e.g., each based on the location (x0, y0) of marker 410 and further based on one or more test criteria—to determine whether alignment of the substrate relative to the IC chip is acceptable in either circumstance. In an illustrative scenario according to one embodiment, evaluation based on the one or more test criteria may include determining X-Y co-ordinates of marker 430a and/or X-Y co-ordinates of marker 430b—e.g., relative to X-Y co-ordinates of marker 410. In such an embodiment, misalignment may be indicated by a magnitude and/or direction of an offset of marker 430a (or an offset of marker 430b) from marker 410, as determined based on a preset test condition. By way of illustration and not limitation, one or more test criteria may require that contact pad 404 overlap, in the y-axis dimension, the centroid feature that is variously marked by markers 430a, 430b. In such an embodiment, the configuration corresponding to image 420a would meet such a test criteria, and the configuration corresponding to image 420b would fail that test criteria. Accordingly, the IC-substrate assembly may be deemed insufficiently aligned in the configuration represented by image 420b (as compared to the configuration represented by image 420a). An evaluation of misalignment may be based on any of a variety of additional or alternative test criteria and/or reference features, according to different embodiments.

Figure 5:
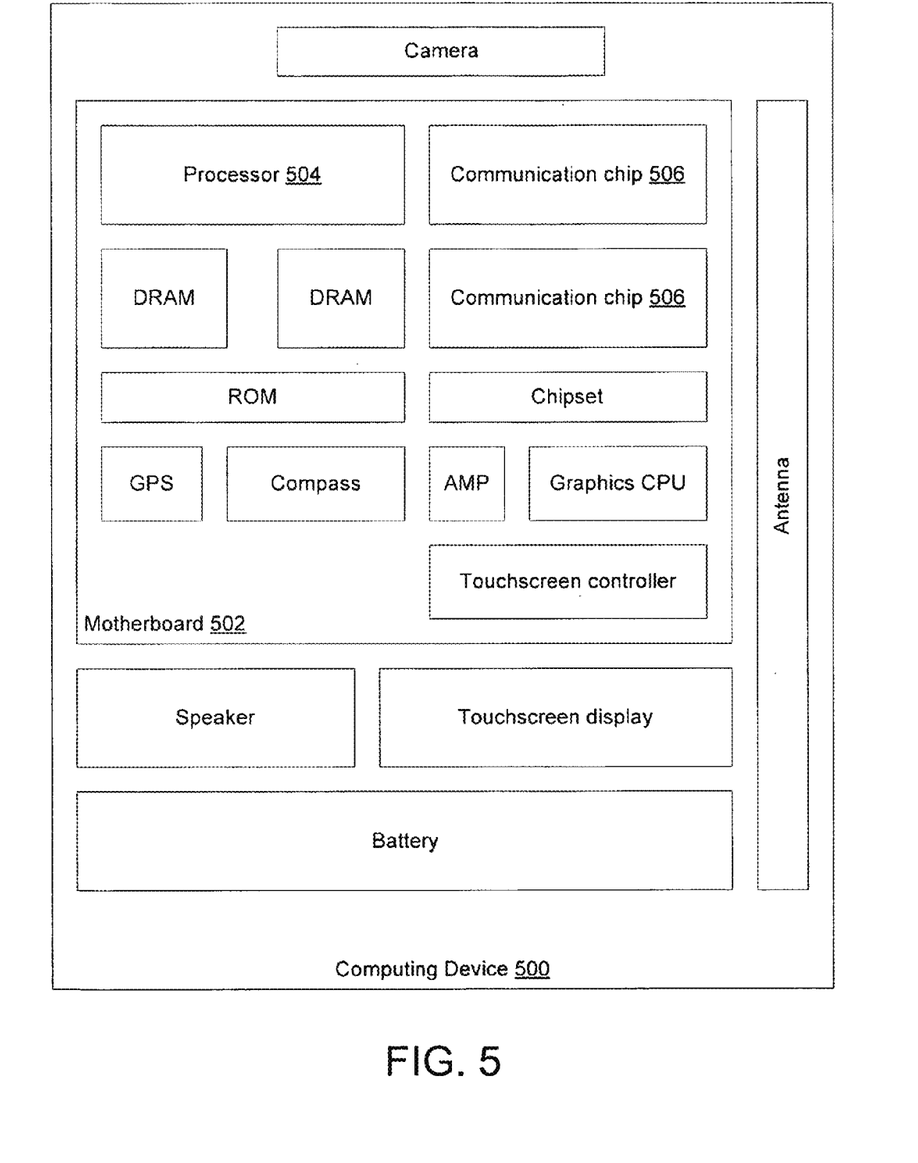
FIG. 5 is a functional block diagram illustrating a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
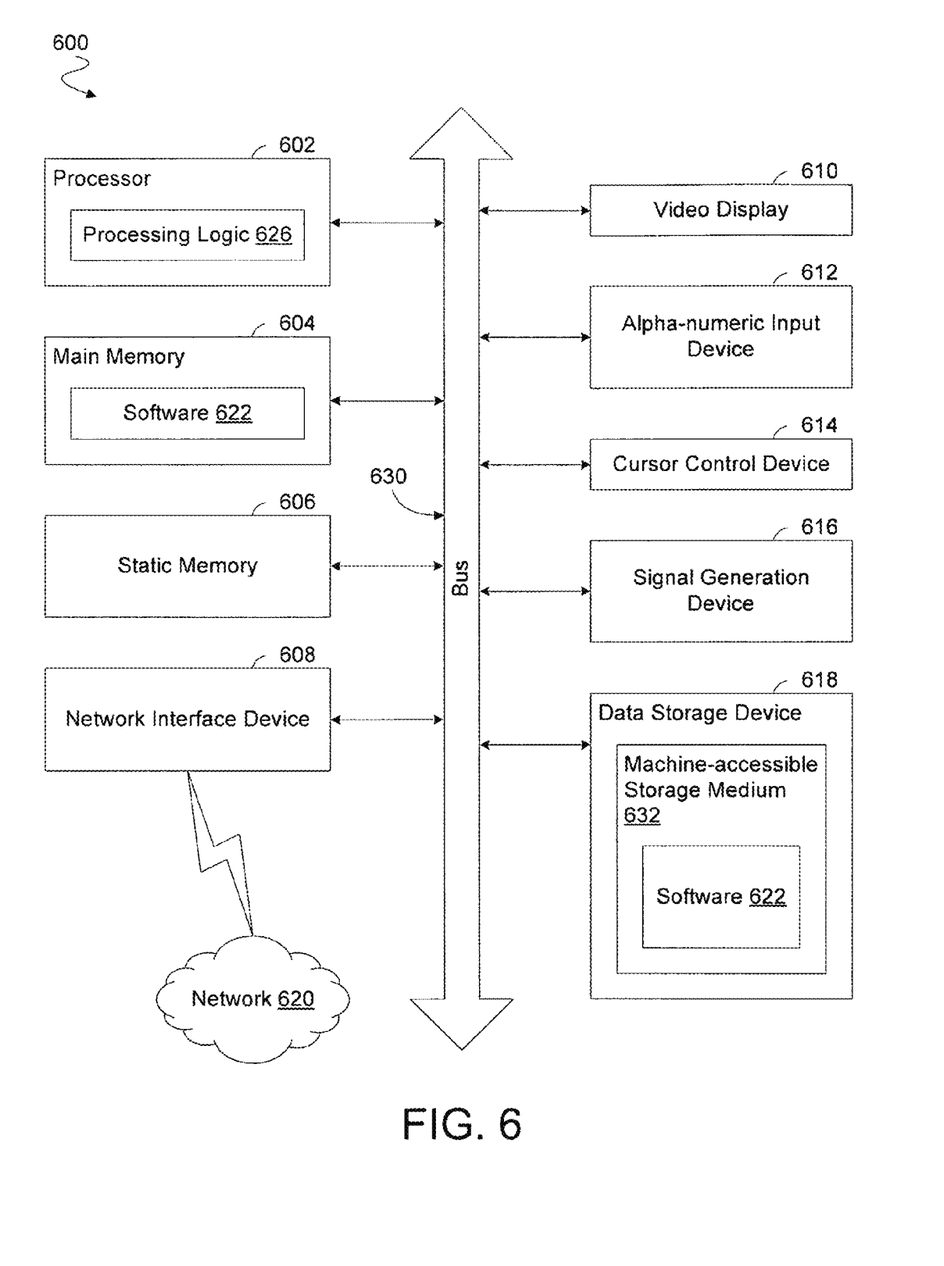
FIG. 6 is a functional block diagram illustrating an exemplary computer system, in accordance with one embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 7:
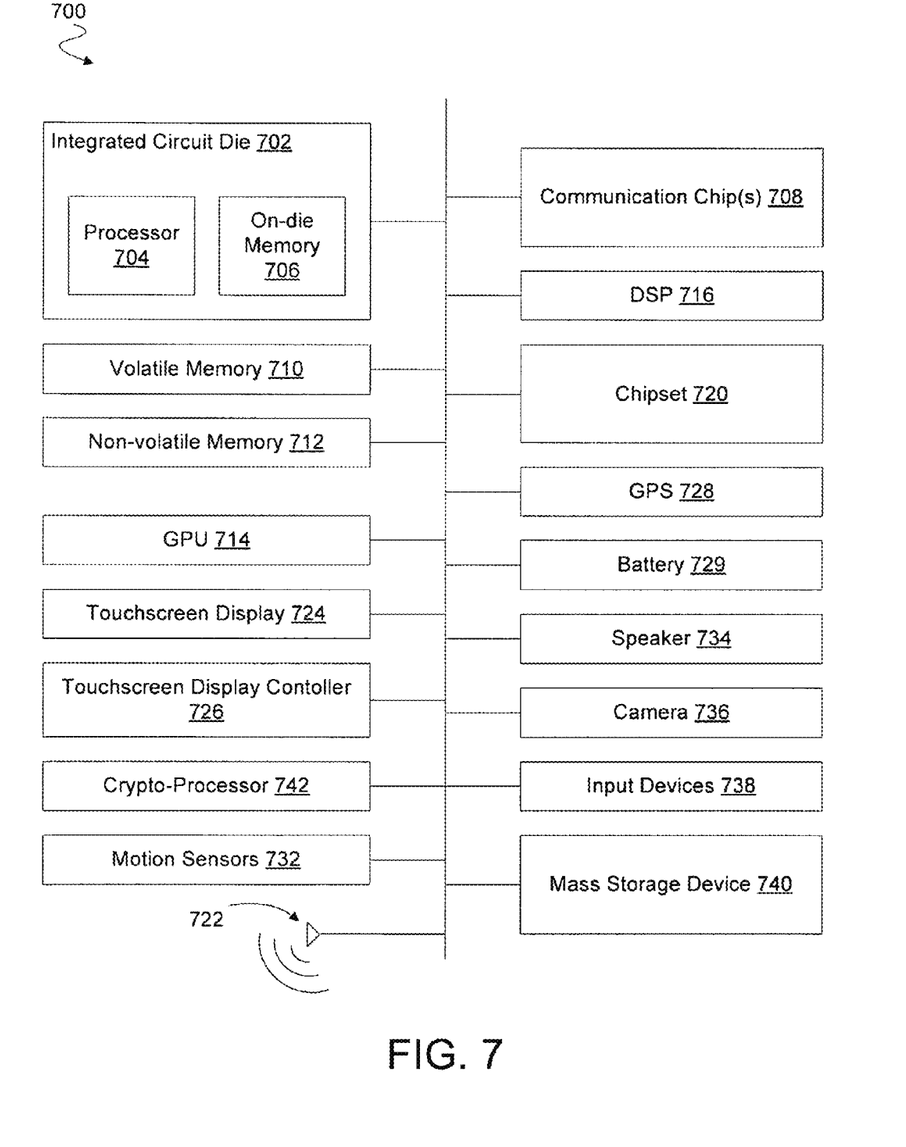
FIG. 7 is a functional block diagram illustrating a computing device built in accordance with an embodiment.

FIG. 7 illustrates a computing device 700 in accordance with one embodiment. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 729 or other power source, a power amplifier (not shown), a global positioning system (GPS) device 728, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

In one implementation, a system comprises an optics unit and control logic including circuitry to configure the optics unit to focus first radiation on a first plane and to further configure the optics unit to focus second radiation on a second plane offset from the first plane along a line of direction perpendicular to a surface of an integrated circuit (IC) chip. The system further comprises a photodetector to perform a first measurement based on a reflection of a first portion of the first radiation from the IC chip toward the optics unit, the photodetector further to perform a second measurement based on a reflection of a second portion of the second radiation from a substrate toward the optics unit, wherein the photodetector to generate, based on the first measurement and the second measurement, one or more signals indicating a position of the IC chip relative to the substrate.

In one embodiment, the first radiation and the second radiation include infrared laser light. In another embodiment, the control logic to configure the optics unit to focus the second radiation in the second plane includes the control logic to signal that the optics unit is to move closer to the IC chip or farther from the IC chip. In another embodiment, the control logic is further to signal that a first plurality of measurements are to be taken with the photodetector each while the optics unit focuses the first radiation on the first plane, the first plurality of measurements including the first measurement, wherein, during the first plurality of measurements, the control logic further to signal that the IC chip and the substrate are to be moved in a direction parallel to the first plane. In another embodiment, the control logic is further to signal that a second plurality of measurements are to be taken with the photodetector each while the optics unit focuses the second radiation on the second plane, the second plurality of measurements including the second measurement, wherein, during the second plurality of measurements, the control logic further to signal that the IC chip and the substrate are to be moved in a direction parallel to the second plane. In another embodiment, the system further comprises a test unit comprising circuitry configured to identify, based on the one or more signals and reference information, a magnitude or a direction of a misalignment of the IC chip relative to the substrate. In another embodiment, the system further comprises an attenuator optically coupled to the photodetector, the attenuator to reduce an amplitude of the first portion of the first radiation prior to the first measurement.

In another implementation, a method comprises focusing first radiation on a first plane with an optics unit, performing a first measurement based on a reflection of a first portion of the first radiation from an integrated circuit (IC) toward the optics unit, focusing second radiation with the optics unit on a second plane offset from the first plane along a line of direction perpendicular to a surface of the IC chip, performing a second measurement based on a reflection of a second portion of the second radiation from a substrate toward the optics unit, and based on the first measurement and the second measurement, determining a position of the IC chip relative to the substrate.

In one embodiment, the first radiation and the second radiation include infrared laser light. In another embodiment, the method further comprises transitioning between the focusing the first radiation on the first plane and the focusing the second radiation on the second plane, including signaling the optics unit to move closer to the IC chip or farther from the IC chip. In another embodiment, the method further comprises signaling that a first plurality of measurements are to be taken each while the optics unit focuses the first radiation on the first plane, the first plurality of measurements including the first measurement, and during the first plurality of measurements, signaling that the IC chip and the substrate are to be moved in a direction parallel to the first plane. In another embodiment, the method further comprises signaling that a second plurality of measurements are to be taken each while the optics unit focuses the second radiation on the second plane, the second plurality of measurements including the second measurement, and during the second plurality of measurements, signaling that the IC chip and the substrate are to be moved in a direction parallel to the second plane. In another embodiment, the method further comprises, based on the one or more signals and reference information, identifying a magnitude or a direction of a misalignment of the IC chip relative to the substrate. In another embodiment, the method further comprises reducing an amplitude of the first portion of the first radiation prior to the first measurement.

In another implementation, a non-transitory computer-readable storage medium has stored thereon instructions which, when executed by one or more processing units, cause the one or more processing units to perform a method comprising focusing first radiation on a first plane with an optics unit, performing a first measurement based on a reflection of a first portion of the first radiation from an integrated circuit (IC) toward the optics unit, and focusing second radiation with the optics unit on a second plane offset from the first plane along a line of direction perpendicular to a surface of the IC chip. The method further comprises performing a second measurement based on a reflection of a second portion of the second radiation from a substrate toward the optics unit, and based on the first measurement and the second measurement, determining a position of the IC chip relative to the substrate.

In another embodiment, the first radiation and the second radiation include infrared laser light. In another embodiment, the method further comprises transitioning between the focusing the first radiation on the first plane and the focusing the second radiation on the second plane, including signaling that the optics unit is to move closer to the IC chip or farther from the IC chip. In another embodiment, the method further comprises signaling that a first plurality of measurements are to be taken each while the optics unit focuses the first radiation on the first plane, the first plurality of measurements including the first measurement, and during the first plurality of measurements, signaling that the IC chip and the substrate are to be moved in a direction parallel to the first plane. In another embodiment, the method further comprises signaling that a second plurality of measurements are to be taken each while the optics unit focuses the second radiation on the second plane, the second plurality of measurements including the second measurement, and during the second plurality of measurements, signaling that the IC chip and the substrate are to be moved in a direction parallel to the second plane. In another embodiment, the method further comprises, based on the one or more signals and reference information, identifying a magnitude or a direction of a misalignment of the IC chip relative to the substrate.

Techniques and architectures for measuring misalignment of circuit structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system comprising:
an optics unit;
control logic including circuitry to configure the optics unit to focus first radiation on a first plane and to further configure the optics unit to focus second radiation on a second plane offset from the first plane along a line of direction perpendicular to a surface of an integrated circuit (IC) chip; and
a photodetector to perform a first measurement based on a reflection of a first portion of the first radiation from the IC chip toward the optics unit, the photodetector further to perform a second measurement based on a reflection of a second portion of the second radiation from a substrate toward the optics unit, wherein the photodetector to generate, based on the first measurement and the second measurement, one or more signals indicating a position of the IC chip relative to the substrate.

2. The system of claim 1, wherein the first radiation and the second radiation include infrared laser light.

3. The system of claim 1, wherein the control logic to configure the optics unit to focus the second radiation in the second plane includes the control logic to signal that the optics unit is to move closer to the IC chip or farther from the IC chip.

4. The system of claim 1, the control logic further to signal that a first plurality of measurements are to be taken with the photodetector each while the optics unit focuses the first radiation on the first plane, the first plurality of measurements including the first measurement, wherein, during the first plurality of measurements, the control logic further to signal that the IC chip and the substrate are to be moved in a direction parallel to the first plane.

5. The system of claim 4, the control logic further to signal that a second plurality of measurements are to be taken with the photodetector each while the optics unit focuses the second radiation on the second plane, the second plurality of measurements including the second measurement, wherein, during the second plurality of measurements, the control logic further to signal that the IC chip and the substrate are to be moved in a direction parallel to the second plane.

6. The system of claim 1, further comprising a test unit comprising circuitry configured to identify, based on the one or more signals and reference information, a magnitude or a direction of a misalignment of the IC chip relative to the substrate.

7. The system of claim 1, further comprising an attenuator optically coupled to the photodetector, the attenuator to reduce an amplitude of the first portion of the first radiation prior to the first measurement.

8. A method comprising:
with an optics unit, focusing first radiation on a first plane;
performing a first measurement based on a reflection of a first portion of the first radiation from an integrated circuit (IC) toward the optics unit;
with the optics unit, focusing second radiation on a second plane offset from the first plane along a line of direction perpendicular to a surface of the IC chip;
performing a second measurement based on a reflection of a second portion of the second radiation from a substrate toward the optics unit; and
based on the first measurement and the second measurement, determining a position of the IC chip relative to the substrate.

9. The method of claim 8, wherein the first radiation and the second radiation include infrared laser light.

10. The method of claim 8, further comprising transitioning between the focusing the first radiation on the first plane and the focusing the second radiation on the second plane, including signaling the optics unit to move closer to the IC chip or farther from the IC chip.

11. The method of claim 8, further comprising:
signaling that a first plurality of measurements are to be taken each while the optics unit focuses the first radiation on the first plane, the first plurality of measurements including the first measurement; and
during the first plurality of measurements, signaling that the IC chip and the substrate are to be moved in a direction parallel to the first plane.

12. The method of claim 11, further comprising:
signaling that a second plurality of measurements are to be taken each while the optics unit focuses the second radiation on the second plane, the second plurality of measurements including the second measurement; and
during the second plurality of measurements, signaling that the IC chip and the substrate are to be moved in a direction parallel to the second plane.

13. The method of claim 8, further comprising:
based on the one or more signals and reference information, identifying a magnitude or a direction of a misalignment of the IC chip relative to the substrate.

14. The method of claim 8, further comprising:
reducing an amplitude of the first portion of the first radiation prior to the first measurement.

15. A non-transitory computer-readable storage medium having stored thereon instructions which, when executed by one or more processing units, cause the one or more processing units to perform a method comprising:
with an optics unit, focusing first radiation on a first plane;
performing a first measurement based on a reflection of a first portion of the first radiation from an integrated circuit (IC) toward the optics unit;
with the optics unit, focusing second radiation on a second plane offset from the first plane along a line of direction perpendicular to a surface of the IC chip;
performing a second measurement based on a reflection of a second portion of the second radiation from a substrate toward the optics unit; and
based on the first measurement and the second measurement, determining a position of the IC chip relative to the substrate.

16. The computer-readable storage medium of claim 15, wherein the first radiation and the second radiation include infrared laser light.

17. The computer-readable storage medium of claim 15, the method further comprising transitioning between the focusing the first radiation on the first plane and the focusing the second radiation on the second plane, including signaling that the optics unit is to move closer to the IC chip or farther from the IC chip.

18. The computer-readable storage medium of claim 15, the method further comprising:
signaling that a first plurality of measurements are to be taken each while the optics unit focuses the first radiation on the first plane, the first plurality of measurements including the first measurement; and
during the first plurality of measurements, signaling that the IC chip and the substrate are to be moved in a direction parallel to the first plane.

19. The computer-readable storage medium of claim 18, the method further comprising:

signaling that a second plurality of measurements are to be taken each while the optics unit focuses the second radiation on the second plane, the second plurality of measurements including the second measurement; and during the second plurality of measurements, signaling that the IC chip and the substrate are to be moved in a direction parallel to the second plane.

20. The computer-readable storage medium of claim 15, the method further comprising:

based on the one or more signals and reference information, identifying a magnitude or a direction of a misalignment of the IC chip relative to the substrate.

\* \* \* \* \*